United States Patent
Schindler et al.

(10) Patent No.: US 10,877,331 B2
(45) Date of Patent: Dec. 29, 2020

(54) OBJECT PROVIDED WITH AN ELECTRO-OPTIC DISPLAY DEVICE

(71) Applicant: The Swatch Group Research and Development Ltd, Marin (CH)

(72) Inventors: Axel Schindler, Ins (CH); Alain Hamm, Neuchatel (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days.

(21) Appl. No.: 16/654,173

(22) Filed: Oct. 16, 2019

(65) Prior Publication Data
US 2020/0142239 A1    May 7, 2020

(30) Foreign Application Priority Data

Nov. 6, 2018    (EP) .................................... 18204700

(51) Int. Cl.
*G02F 1/1345*    (2006.01)
*G02F 1/1333*    (2006.01)
(Continued)

(52) U.S. Cl.
CPC ........ *G02F 1/13452* (2013.01); *G02F 1/1339* (2013.01); *G02F 1/133308* (2013.01);
(Continued)

(58) Field of Classification Search
CPC ... G04C 19/00; G04B 19/30; G02F 1/133308; G02F 1/1339; G04G 9/007; G04G 9/10; G04G 9/12; H01L 27/32; H01L 51/5259
(Continued)

(56) References Cited

U.S. PATENT DOCUMENTS

| 6,208,591 B1 * | 3/2001 | Sakurazawa ........... G04B 19/30 368/67 |
| 2002/0071347 A1 * | 6/2002 | Gilomen .............. G04G 9/0082 368/82 |

(Continued)

FOREIGN PATENT DOCUMENTS

| EP | 2 784 607 A1 | 10/2014 |
| JP | H11-64549 A | 3/1999 |
| JP | 2002-296375 A | 10/2002 |

OTHER PUBLICATIONS

European Search Report dated Apr. 10, 2019 in European Application 18204700.1 filed on Nov. 6, 2018 (with English Translation of Categories of Cited Documents).

(Continued)

*Primary Examiner* — Charles S Chang
(74) *Attorney, Agent, or Firm* — Oblon, McClelland, Maier & Neustadt, L.L.P.

(57) ABSTRACT

An object includes an electro-optic display device provided with an optically active element having optical properties that can be modified by applying an electric voltage. The object further includes a frame which delimits an opening wherein the electro-optic display device is arranged. The object also includes an external electronic power and control device and elements for the electrical connection of the electro-optic display device to the external electronic power and control device, which are hidden by the frame of the object. The electro-optic display device defines an opaque active display area having a surface area that is less than the surface area of the opening, such that, even when the electro-optic display device is activated and displaying information, a transparent area remains between the active display area and the edges of the frame, whereas an area located beneath the active display area is hidden.

15 Claims, 2 Drawing Sheets

(51) Int. Cl.
- *G02F 1/1339* (2006.01)
- *G04G 9/00* (2006.01)
- *H01L 27/32* (2006.01)
- *H01L 51/52* (2006.01)
- *G02F 1/1335* (2006.01)
- *G04G 9/10* (2006.01)
- *G04G 9/12* (2006.01)

(52) U.S. Cl.
CPC ............ *G04G 9/007* (2013.01); *H01L 27/32* (2013.01); *H01L 51/5259* (2013.01); *G02F 1/133528* (2013.01); *G04G 9/10* (2013.01); *G04G 9/12* (2013.01)

(58) Field of Classification Search
USPC .......................................... 349/70–71, 96–98
See application file for complete search history.

(56) References Cited

U.S. PATENT DOCUMENTS

| | | |
|---|---|---|
| 2014/0293758 A1 | 10/2014 | Fleury et al. |
| 2015/0029829 A1 | 1/2015 | Spadini |
| 2017/0168461 A1 | 6/2017 | Bang et al. |
| 2017/0168463 A1 | 6/2017 | Hong et al. |
| 2017/0176951 A1* | 6/2017 | Hsieh .................. G04G 17/045 |

OTHER PUBLICATIONS

Notice of the Reason for Refusal dated Sep. 23, 2020 in corresponding Japanese Patent Application No. 2019-195035 (with English translation)(7 pages).

\* cited by examiner

OBJECT PROVIDED WITH AN ELECTRO-OPTIC DISPLAY DEVICE

CROSS-REFERENCE TO RELATED APPLICATION

This application claims priority to European Patent Application No. 18204700.1 filed on Nov. 6, 2018, the entire disclosure of which is hereby incorporated herein by reference.

TECHNICAL FIELD OF THE INVENTION

The present invention relates to an object provided with an electro-optic display. More specifically, the invention relates to an object such as a timepiece or a smartphone comprising a frame delimiting an opening wherein the electro-optic display device is arranged.

TECHNOLOGICAL BACKGROUND OF THE INVENTION

The present invention relates to the field of electro-optic display devices. These electro-optic display devices conventionally comprise at least one substrate which acts as a support for an optically active element disposed between at least one electrode and one corresponding auxiliary electrode, whose optical properties can be modified by applying an electric current or voltage. The display devices that comply with this definition in particular include liquid crystal display devices (also known as LCD devices), organic light emitting diode devices (also known as OLED devices), electrochromic display devices and electrophoretic display devices.

For the purposes of illustration only, the case of a liquid crystal display device can be considered, for example of the twisted nematic (TN) type comprising a front substrate which extends parallel to and remotely from a rear substrate. These front and rear substrates are joined to one another by means of a sealing frame which delimits a sealed enclosure confining the liquid crystal. Electrodes and auxiliary electrodes are structured on the faces facing each other of the front and rear substrates. The application of an electric voltage between a determined electrode and a determined auxiliary electrode makes it possible to modify the optical properties of the liquid crystal at the crossing point between this electrode and this auxiliary electrode.

In order to ensure correct operation of a liquid crystal display device, the electrodes and auxiliary electrodes thereof must be connected to an electronic power and control device at least partially located externally to the display device. For this purpose, one of the two substrates, usually the rear substrate, is provided such that it is larger than the front substrate and this additional surface is used to extend, via electrically-conductive tracks, the auxiliary electrodes supported by the rear substrate outside of the sealing frame of the display device. Similarly, the electrodes supported by the front substrate are transferred to the rear substrate, for example by means of electricity-conductive balls dispersed in the sealing frame. These electrically-conductive balls are in contact, on the one hand with the electrodes, and on the other hand with conductive tracks which run along the rear substrate and allow these electrodes to be extended outside of the sealed enclosure delimited by said sealing frame. Thanks to electrical connectors, the conductive tracks, and thus the electrodes and auxiliary electrodes of the liquid crystal display device can be connected to the external electronic power and control device.

Numerous applications exist today wherein an object, in particular a portable object, is equipped with a device for displaying information such as a display device with hands or an electro-optic display device, for example a liquid crystal display device of the type described briefly hereinabove. Among the examples that immediately come to mind are timepieces such as wristwatches or smartphones. Such portable objects comprise a frame (also referred to as a "middle part" in the specific case of wristwatches) which delimits an opening that is closed by a crystal. This crystal comprises a top surface directed towards an observer and a bottom surface, opposite the top surface, directed towards the interior of the portable object. The display device, for example a liquid crystal or hand display device, is intended to display information that will be discernible to the user through the opening delimited by the frame of the portable object.

In the prior art, objects exist, in particular portable objects such as a wristwatch or smartphone, which comprise a second electro-optic display device disposed above the first display device. One example of such an object is a wristwatch comprising a twisted nematic liquid crystal display device disposed above a second electro-optic display device. The front substrate through which the information displayed by the liquid crystal display device is visible has a dimension equal to or substantially the same as that of the opening delimited by the middle part of the wristwatch, whereas the rear substrate has a larger dimension than the front substrate in order to provide a sufficient surface area for arranging all of the elements required for the electrical connection of the liquid crystal display device to the external electronic power and control device thereof. The portion of the rear substrate that exceeds the dimensions of the front substrate and that is used for attaching the electrical connection elements extends below the middle part of the wristwatch and is thus hidden from the user's view.

In these embodiments of the prior art, the active area of the upper electro-optic display device, i.e. the scope over which such an electro-optic display device can display information, is substantially equal to the scope of the opening delimited by the frame of the object. This is well suited to the case of an object such as a wristwatch which comprises two superimposed display devices of the electro-optic type. More specifically, the upper electro-optic display device is arranged such that, when not displaying information, it is semi-transparent and allows information displayed by the lower electro-optic display device to be viewed. However, this solution appears less suited to the case where the lower display device is not an electro-optic display device. Such is the case, for example, if an object such as a wristwatch is equipped, for example, with a dial above which indicator hands move. More specifically, since the electro-optic display device that is arranged above the hand display device is disposed between two polarisers, less than 50% of the external light that falls on this electro-optic display device will penetrate the inside of the watch case, such that the dial and the hands moving thereabove will appear dark and difficult to perceive by the user.

There is thus a need in the prior art for an object, in particular a portable object such as a wristwatch or a smartphone, comprising a frame that delimits an opening through which can be viewed not only the information displayed by the electro-optic display device, but also the information displayed by a second display device arranged beneath the electro-optic display device, while hiding from the user's view the construction elements and electrical connection elements, whose view thereof would be aesthetically detrimental for the object.

SUMMARY OF THE INVENTION

The purpose of the present invention is thus to fulfil the aforementioned and other needs by providing an object, in particular a portable object such as a timepiece or a smartphone, provided with a first electro-optic display device and a second display device arranged beneath the electro-optic display device, the information displayed respectively by the first electro-optic display device and by the second display device being discernible through the opening delimited by the frame with which the object is equipped. In particular, all of the elements required for the electrical connection of the first electro-optic display device to the external electronic power and control device thereof must remain indiscernible to the user.

For this purpose, the present invention relates to an object, in particular a portable object such as a timepiece or smartphone, this object comprising an electro-optic display device provided with an optically active element, whose optical properties can be modified by applying an electric voltage or current between at least one electrode and one corresponding auxiliary electrode, between which the optically active element is disposed, the object further comprising a frame which delimits an opening wherein the electro-optic display device is arranged, the object further comprising an external electronic power and control device in addition to elements for the electrical connection of the electro-optic display device to the external electronic power and control device, the external electronic power and control device, as well as the electrical connection elements being hidden by the frame of the object, the electro-optic display device defining an opaque active display area, the surface area thereof being less than the surface area of the opening delimited by the frame, such that, even when the electro-optic display device is activated and displays information, a transparent area remains between the active display area and the edges of the frame, whereas an area located beneath the active display area is hidden.

Thanks to these features, the present invention provides an object, in particular a portable object such as a wristwatch or a smartphone, provided with an electro-optic display device, an opaque active display area thereof having a surface area that is less than that of the opening delimited by the frame of the object. As a result, even when the active display area is displaying information, a transparent area devoid of any displayed information remains around this active display area and as far as the edge of the frame of the object, through which transparent area can be very clearly perceived what is located beneath the electro-optic display device. The user thus has a direct and clear view on what is located beneath the transparent area. Conversely, since the active display area of the electro-optic display device is opaque, what is located beneath this active display area is not perceived. An object, in particular a wristwatch, is thus obtained that can be qualified as mysterious given that the active display area of the electro-optic device is surrounded by a transparent area that does not allow any of the external electronic power and control device to be viewed, nor the elements for the electrical connection of the electro-optic display device to the external electronic power and control device, such that the active display area does not appear to be connected to anything.

According to one specific embodiment of the invention, the opening that is delimited by the frame is closed by the electro-optic display device.

According to another specific embodiment of the invention, the object comprises a crystal that closes the opening and that comprises a top surface directed towards the exterior of the object, and a bottom surface directed towards the interior of the object and to which the electro-optic display device is attached.

According to yet another specific embodiment of the invention, the electro-optic display device comprises a transparent front substrate via which the electro-optic display device is attached to the bottom surface of the crystal, the electro-optic display device further comprising a rear substrate that extends parallel to and remotely from the front substrate, the dimensions of the front substrate being equal to or substantially the same as those of the crystal, whereas the dimensions of the rear substrate exceed those of the crystal in order to have a sufficient surface area for arranging the elements required for the electrical connection of the electro-optic display device.

According to yet another specific embodiment of the invention, the object comprises a second device for displaying information arranged beneath the electro-optic display device and at least partially visible through the transparent area.

One example illustrating the possibilities procured by the present invention is that of a wristwatch equipped with an electro-optic display device according to the present invention and further comprising a dial provided with hands arranged beneath the electro-optic display device. Thanks to the features of the invention, the user of the wristwatch thus simultaneously views through the opening delimited by the middle part of his/her watch the digital information displayed by the active area of the electro-optic display device, and the analogue information displayed by the hands that move over the dial. Thanks to the invention, a hybrid watch is thus obtained, provided with a "screen"-type display and an analogue display, the appearance thereof being original and innovative. However, it should be noted that the present invention is not limited to the use of an analogue display device disposed beneath the electro-optic display device, and that a first and a second electro-optic display device can very well be combined with one another, the second electro-optic display device thus being adapted such that it displays information in areas that are not covered by the active display area of the first electro-optic display device. There is thus the possibility of choosing to activate only the first electro-optic display device attached beneath the crystal, or only the second electro-optic display device disposed beneath the first, or to activate the first and second electro-optic display devices simultaneously.

BRIEF DESCRIPTION OF THE FIGURES

Other characteristics and advantages of this invention will be better understood upon reading the following detailed description of one example embodiment of a portable object of the wristwatch type according to the invention, said example being provided for the purposes of illustration only and not intended to limit the scope of the invention, given with reference to the accompanying drawing, wherein.

DETAILED DESCRIPTION OF ONE EMBODIMENT OF THE INVENTION

Figure 1:
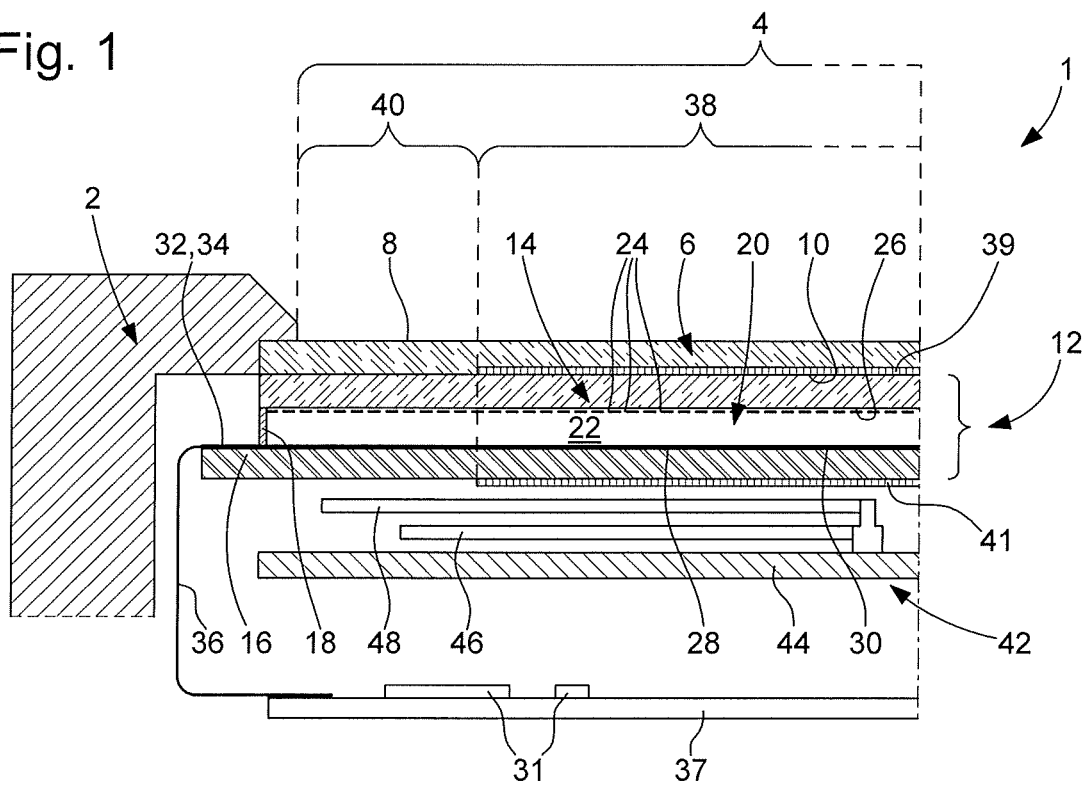
FIG. 1 is a partial, sectional view of a watch case, a middle part thereof delimiting an opening closed by a crystal, and to the bottom surface of which an electro-optic display device of the liquid crystal display device type is rigidly connected.

The present invention was drawn from the general inventive idea consisting of arranging an electro-optic display device in an opening delimited by a frame of an object, in particular a portable object such as a wristwatch or a smartphone. The originality of the electro-optic display device is that the dimensions thereof are the same or slightly greater than those of the opening, but that the active display area thereof is opaque and has a surface area whose dimensions are less than those of the opening. As a result, even when the electro-optic display device is activated and is displaying information, a transparent area devoid of any displayed information remains between the active display area thereof and the edges of the frame of the object, which transparent area provides the object with a mysterious nature since it does not allow the user to guess to what and how the electro-optic display device is connected for the power supply and control thereof. According to one specific embodiment of the invention, a second device for displaying information arranged beneath the electro-optic display device is at least partially visible through the transparent area. This second device for displaying information can be of any kind: it can simply be a decorative pattern; it can also be a second electro-optic display device. According to a preferred alternative embodiment of the invention, the second display device is a dial above which hands move. Thanks to the invention, a hybrid watch is thus obtained, provided with a "screen"-type display and an analogue display, the appearance thereof being original and innovative. In particular, all of the elements located below the transparent area are perfectly visible to the user, whereas the elements located below the active display area are indiscernible.

The present invention will now be described with reference to a portable object of the wristwatch type equipped with an electro-optic display device of the liquid crystal display device type. It goes without saying that this example is provided for illustrative, non-limiting purposes only and that the object can be something other than a timepiece. Broadly speaking, it concerns any type of object, such as a telephone or laptop comprising a frame that delimits an opening through which information displayed by the electro-optic display device is discernible. Similarly, the choice of electro-optic display device is not limited to liquid crystal display devices and in particular extends to display devices of the organic light emitting diode type, as well as to electrophoretic display devices and to electrochromic display devices. More specifically, these different types of electro-optic display devices all comprise at least one substrate which acts as a support for an optically active element (for example twisted nematic or super-twisted nematic or vertical alignment liquid crystal for a liquid crystal display device, active hole-injection layers for an organic light emitting diode display device, black and white particles or colour particles dispersed in a fluid in the case of electrophoretic display devices, liquid or solid electrolyte in the case of electrochromic display devices), and sets of electrodes and auxiliary electrodes used to modify the optical properties of the optically active element by applying an electric current or voltage.

It should be noted that, as per the present invention, the term "active display area of an electro-optic display device" is understood to mean the useful portion of the front surface of the electro-optic display device on which information elements can be displayed. By way of example, in the case of an electro-optic display device of the twisted nematic liquid crystal type, two front and rear substrates are present, which extend parallel to and remotely from one another, and which are joined to one another by a sealing frame which delimits a sealed enclosure for confining the liquid crystal. A front polariser film is attached to the top of the front substrate and the polarisation direction thereof forms a 90° angle with the polarisation direction of a rear polariser film attached to the bottom of the rear substrate. In such a case, the polarisers are referred to as crossed. In this case, the information displayed by the electro-optic display device in the active display area thereof will appear dark against a transparent background. For the active display area to appear opaque, the rear polariser film can be combined with a reflector or an opaque backlighting device can be provided beneath the rear substrate. Instead of the backlighting device, an opaque film can also be used.

The polarisers can also be parallel, i.e. the polarisation directions thereof can be parallel to one another. Yet another embodiment consists of combining a circular polariser attached to the top of the front substrate with a metal reflector arranged inside the liquid crystal display device, on the top of the rear substrate. The active display area is thus defined as the volume of liquid crystal comprised between the front polariser film and the rear polariser film or between the circular polariser film and the metal reflector.

Denoted as a whole by the general reference numeral 1, the wristwatch case shown only partially in a sectional view in FIG. 1 comprises a frame 2, which is hereafter preferably referred to as the "middle part". This middle part 2 delimits an opening 4 that is, for example, circular, and closed in a perfectly sealed manner by a crystal 6. This crystal 6 comprises a top surface 8 directed towards the user and a bottom surface 10, opposite the top surface 8, directed towards the interior of the wristwatch case 1. An electro-optic display device, in this instance a liquid crystal display device 12, comprises a transparent front substrate 14 attached by any suitable means to the bottom surface 10 of the crystal 6. This front substrate 14 extends parallel to and remotely from a rear substrate 16 that is also transparent. The front substrate 14 and the rear substrate 16 are joined to one another by means of a sealing frame 18 which delimits a sealed enclosure 20 for confining a liquid crystal 22. The liquid crystal display device 12 is, for example, rigidly connected by lamination by means of an optical clear adhesive (OCA) to the bottom surface 10 of the crystal 6. The optical clear adhesive has the advantage of preventing parasitic optical reflection issues at the interface between the crystal 6 and the liquid crystal display device 12. Electrodes 24 made of an electrically-conductive, transparent material such as indium-tin oxide (ITO) are structured on a bottom face 26 of the front substrate 14 of the liquid crystal display device 12, whereas auxiliary electrodes 28, also made of an electrically-conductive, transparent material, are structured on a top face 30 of the rear substrate 16. The electrodes 24 and the auxiliary electrodes 28 are arranged on either side of the layer of liquid crystal 22. The application of a suitable electric voltage between a given electrode and a given auxiliary electrode modifies the optical properties of the liquid crystal 22 at the crossing point between the electrode and the auxiliary electrode considered.

The dimensions of the front substrate 14 of the liquid crystal display device 12 are identical or greater than those of the opening 4 delimited by the middle part 2. The dimensions of the rear substrate 16 are greater than those of the front substrate 14 and it extends partially beneath the middle part 2 of the wristwatch. It must be remembered that the electrodes 24 and the auxiliary electrodes 28 must be connected to an external electronic power and control device 31. For this purpose, the rear substrate 16 is designed such that it is larger than the front substrate 14 and this additional surface area is used to extend, via first electrically-conductive tracks 32 made of an electrically-conductive, transparent material such as indium-tin oxide (ITO), the auxiliary electrodes 28 supported by the rear substrate 16 outside of the sealing frame 18 of the liquid crystal display device 22. Similarly, the electrodes 24 supported by the front substrate 14 are transferred to the rear substrate 16, for example by means of electricity-conductive balls and dispersed in the sealing frame 18. These balls allow the electrodes 24 to be placed in electrical contact with second conductive tracks 34 also made of an electrically-conductive, transparent material such as ITO and which run along the rear substrate 16, allowing these electrodes 24 to be extended outside of the sealed enclosure delimited by said sealing frame 18. Thanks to a flexible printed circuit (FPC) 36, the conductive tracks 32, 34 can be connected and, as a result, the electrodes 24 and the auxiliary electrodes 28 of the liquid crystal display device 12 can be connected to the external electronic power and control device 31 arranged on a printed circuit board 37. Since the first and second conductive tracks 32, 34 are transparent and since the flexible printed circuit 36 is hidden by the middle part 2 of the wristwatch, all of these elements are hidden from the user's view. Preferably, the printed circuit board 37 is disposed beneath the liquid crystal display device 12.

Figure 2:
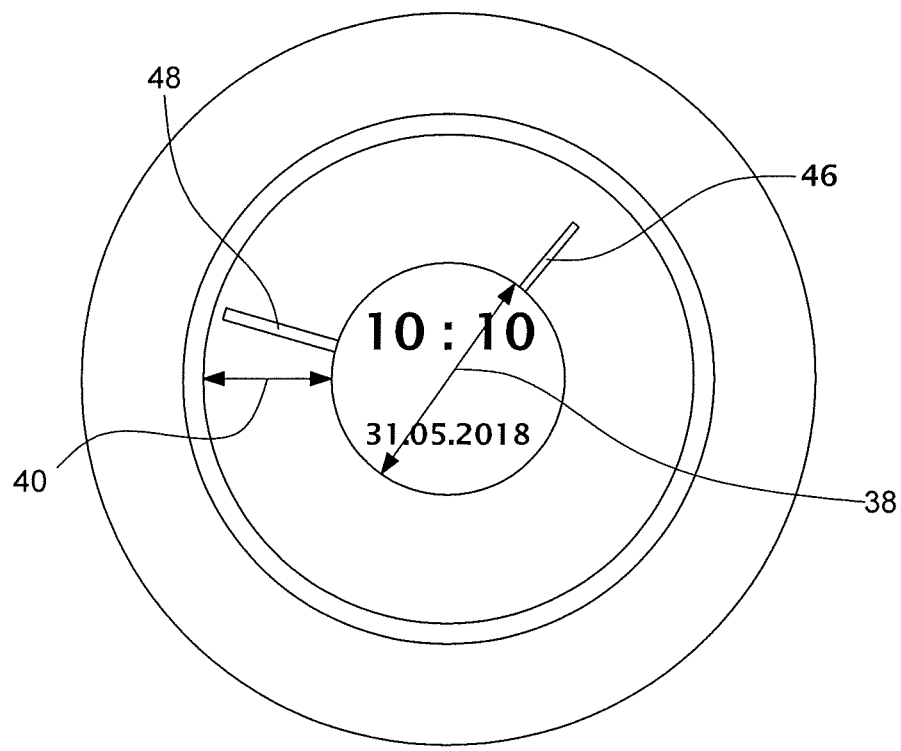
FIG. 2 is an overhead view of the watch shown in FIG. 1.

As stated hereinabove, the active display area 38 of the liquid crystal display device 12 is defined by the volume of the liquid crystal 22 confined inside the perimeter of the sealing frame 18 and which is comprised between an upper polariser 39 and a lower polariser 41. These polarisers 39, 41 can be crossed, i.e. the polarisation directions thereof form a right angle, or parallel, i.e. the polarisation directions thereof extend parallel to one another. According to the invention, and as shown in FIGS. 1 and 2 accompanying this patent application, the scope of this active display area 38 is less than the surface area of the front substrate 14. As a result, even when the liquid crystal display device 12 is activated and is displaying information, a transparent area 40 devoid of any displayed information remains between the active display area 38 thereof and the edges of the middle part 2 of the wristwatch, through which transparent area a second device 42 for displaying information can be viewed, arranged beneath the liquid crystal display device 12. This second device 42 for displaying information can be of any kind: it can simply be a decorative pattern; it can also be a second electro-optic display device. According to a preferred alternative embodiment of the invention shown in FIGS. 1 and 2, the second display device 42 is formed by a dial 44 above which first and second hands 46 and 48 move. Thanks to the invention, a hybrid watch is thus obtained, provided with a "screen"-type display and an analogue display, the appearance thereof being original and innovative.

It is evident that the present invention is not limited to the embodiment described above and that various simple alternatives and modifications can be considered by a person skilled in the art without departing from the scope of the invention as defined by the accompanying claims. In particular, it is understood in the present invention that the opening delimited by the frame of the object, for example the middle part of a wristwatch, can be closed either directly by the electro-optic display device or by a crystal, to a bottom face of which the liquid crystal display device is attached. Thus, as described hereinabove, the liquid crystal display device 12 can be rigidly connected to the bottom surface 10 of the crystal 6 via the front substrate 14 thereof. Nonetheless, the crystal 6 can also be omitted and the opening 4 delimited by the frame 2 of the portable object can be directly closed by means of the front substrate 14 of the liquid crystal display device 12.

Figure 3:
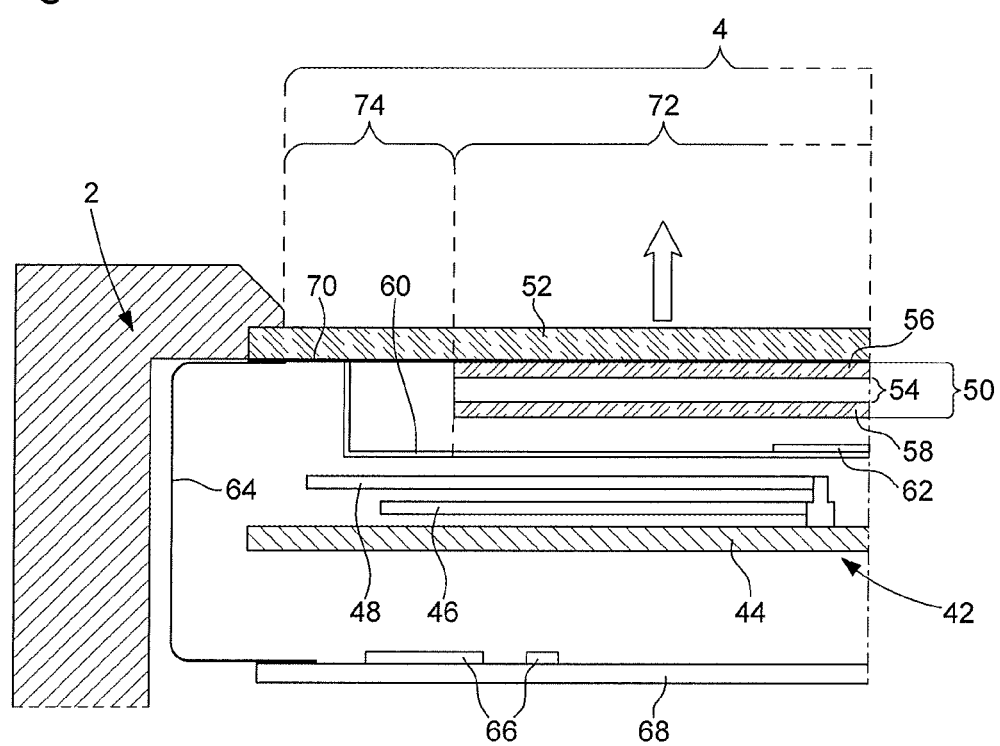
FIG. 3 is a view similar to that of FIG. 1 in the case where the electro-optic display device is an organic light emitting diode (OLED) display device.

According to another embodiment of the invention shown in FIG. 3, an organic light emitting diode (OLED) display device is used. Denoted as a whole by the general reference numeral 50, this OLED display device comprises a transparent front substrate 52 that acts as a support for a stack of organic layers 54 sandwiched between an anode 56 and a cathode 58. The set of layers of the OLED display device 50 is protected from humidity by a cover 60 which defines a sealed enclosure wherein a humidity-absorbing device 62 is arranged. Alternatively, the set of layers of the OLED display device 50 can be protected by the deposition of thin films. These thin films can be deposited by atomic layer deposition (ALD). A flexible printed circuit 64 allows the OLED display device 50 to be connected to an external electronic power and control device 66 arranged on a printed circuit board 68 via conductive tracks 70 which extend outside of the sealed enclosure delimited by the cover 60. Preferably, the printed circuit board 68 is disposed beneath the OLED display device 50. The active display area 72 of the OLED display device 50 is defined by the overlap area between the anode 56 and the cathode 58. This active display area 72 has a metallic appearance in the absence of a circular polariser, and will appear dark if such a circular polariser is used. According to the invention, and as shown in FIG. 3, the scope of the active display area 72 is less than the surface area of the opening 4 delimited by the frame 2 of the portable object. As a result, even when the OLED display device 50 is activated and is displaying information, a transparent area 74 devoid of any displayed information remains between the active display area 72 thereof and the edges of the frame 2 of the portable object, through which transparent area a second display device 42 such as a dial 44 can be viewed, above which first and second hands 46, 48 move. In the example shown in FIG. 3, the OLED display device 50 is of the bottom emission type, i.e. light emerges from the OLED display device 50 through the front substrate 52. The opening 4 delimited by the frame 2 of the portable object can thus be designed to be closed by means of the front substrate 52. It goes without saying that the opening 4 can also be closed by means of a crystal 6 and the OLED display device 50 can be rigidly connected to the bottom surface 10 of the crystal 6 via the front substrate 52 thereof. In the case where the OLED display device 50 is of the top emission type, i.e. the case where light emerges from the OLED display device on the opposite side to the front substrate 52, the opening 4 delimited by the frame 2 of the portable object can be designed to be directly closed by means of the cover 60 of the OLED display device 50, or by rigidly connecting the cover 60 to the bottom surface 10 of the crystal 6. In the case where the OLED display device 50 is protected from humidity by the deposition of thin films over the entirety of the layers thereof, the OLED display device 50 is attached to the bottom surface 10 of the crystal 6 via the thin films.

NOMENCLATURE

1. Wristwatch case
2. Frame
4. Opening
6. Crystal
8. Top surface
10. Bottom surface
12. Liquid crystal display device
14. Front substrate
16. Rear substrate
18. Sealing frame
20. Sealed enclosure
22. Liquid crystal
24. Electrodes
26. Bottom face
28. Auxiliary electrodes
30. Top face
31. External electronic power and control device
32. First electrically-conductive tracks
34. Second electrically-conductive tracks
36. Flexible printed circuit
37. Printed circuit board
38. Active display area
39. Upper polariser
40. Transparent area
41. Lower polariser
42. Second display device
44. Dial
46, 48. First and second hands
50. Organic light emitting diode (OLED) display device
52. Front substrate
54. Stack of organic layers
56. Anode
58. Cathode
60. Cover
62. Humidity absorbing device
64. Flexible printed circuit
66. External electronic power and control device
68. Printed circuit board
70. Conductive tracks
72. Active display area
74. Transparent area

The invention claimed is:

1. An object comprising:
   an electro-optic display device provided with an optically active element, whose optical properties can be modified by applying an electric voltage or current between at least one electrode and one corresponding auxiliary electrode, between which the optically active element is disposed,
   a frame which delimits an opening wherein the electro-optic display device is arranged,
   an external electronic power and control device in addition to elements for the electrical connection of the electro-optic display device to the external electronic power and control device, the external electronic power and control device, as well as the electrical connection elements being hidden by the frame of the object,
   wherein the electro-optic display device defines an opaque active display area, whose surface area is less than the surface area of the opening delimited by the frame, the opaque active display area includes a polarizer, and
   wherein the electro-optic display device includes a transparent area between the active display area and the edges of the frame and the polarizer does not extend into the transparent area such that an area beneath the transparent area is visible when the electro-optic display device is activated and displays information, whereas an area located beneath the active display area is hidden.

2. The object according to claim 1, wherein the opening delimited by the frame is closed by the electro-optic display device.

3. The object according to claim 2, wherein the electro-optic display device comprises at least one transparent front substrate via which the electro-optic display device closes the opening delimited by the frame, the transparent front substrate acting as a support for the optically active element which is disposed between at least one electrode and one corresponding auxiliary electrode, the optical properties thereof being modified by applying a voltage or a current between the electrode and the corresponding auxiliary electrode.

4. The object according to claim 1, further comprising a crystal that closes the opening and that comprises a top surface directed towards the exterior of the object, and a bottom surface directed towards the interior of the object and to which the electro-optic display device is attached.

5. The object according to claim 4, wherein the electro-optic display device comprises at least one transparent front substrate via which the electro-optic display device is attached to the bottom surface of the crystal, the transparent front substrate acting as a support for the optically active element which is disposed between at least one electrode and one corresponding auxiliary electrode, and the optical properties thereof being modified by applying a voltage or a current between the electrode and the corresponding auxiliary electrode.

6. The object according to claim 5, wherein the electro-optic display device further comprises a transparent rear substrate that extends parallel to and remotely from the front substrate, the dimensions of the front substrate being equal to or greater than those of the opening delimited by the frame, whereas the dimensions of the rear substrate exceed those of the front substrate in order to have a sufficient surface area for arranging the elements required for the electrical connection of the electro-optic display device to the external electronic power and control device.

7. The object according to claim 6, wherein the electro-optic display device is a liquid crystal display device, and wherein the front substrate and the rear substrate are joined to one another by a sealing frame which delimits a sealed enclosure for confining a liquid crystal, a volume of liquid crystal comprised between the polarizer, which is an upper polarizer, and a lower polarizer or between the polarizer and a metal reflector defining the active display area of the liquid crystal display device.

8. The object according to claim 7, further comprising a flexible printed circuit which allows the liquid crystal display device to be connected to the external electronic power and control device via electrically-conductive tracks which extend outside of the sealed enclosure delimited by the sealing frame.

9. The object according to claim 1, further comprising a second device for displaying information arranged beneath the electro-optic display device and at least partially visible through the transparent area.

10. The object according to claim 9, wherein the external electronic power and control device is disposed beneath the second display device.

11. The object according to claim 1, wherein the external electronic power and control device is disposed beneath the electro-optic display device.

12. An object comprising:
- an electro-optic display device provided with an optically active element, whose optical properties can be modified by applying an electric voltage or current between at least one electrode and one corresponding auxiliary electrode, between which the optically active element is disposed,
- a frame which delimits an opening wherein the electro-optic display device is arranged,
- an external electronic power and control device in addition to elements for the electrical connection of the electro-optic display device to the external electronic power and control device, the external electronic power and control device, as well as the electrical connection elements being hidden by the frame of the object,
- wherein the electro-optic display device defines an opaque active display area, whose surface area is less than the surface area of the opening delimited by the frame,
- wherein the electro-optic display device includes an OLED display device including an anode and a cathode, the active display area being defined by an overlap area between the anode and the cathode, and
- wherein the electro-optic display device includes a transparent area between the active display area and the edges of the frame and the OLED display device does not extend into the transparent area such that an area beneath the transparent area is visible when the electro-optic display device is activated and displays information, whereas an area located beneath the active display area is hidden.

13. The object according to claim 12, wherein the transparent front substrate supports a stack of organic layers of the OLED display device sandwiched between an anode and a cathode, the OLED display device being protected from humidity by a cover which defines a sealed enclosure wherein a humidity-absorbing device is arranged, or by the deposition of thin films on the stack formed by the anode and the cathode between which extends the stack of organic layers.

14. The object according to claim 13, wherein the active display area of the OLED display device is defined by the overlap area between the anode and the cathode.

15. The object according to claim 13, further comprising a flexible printed circuit which allows the OLED display device to be connected to an external electronic power and control device via conductive tracks which extend outside of the sealed enclosure delimited by the cover or by the thin films.

* * * * *